(12) United States Patent
Wen et al.

(10) Patent No.: US 10,276,380 B2
(45) Date of Patent: Apr. 30, 2019

(54) METHOD OF SEMICONDUCTOR DEVICE FABRICATION

(71) Applicant: Taiwan Semiconductor Manufacturing Company, Ltd., Hsin-Chu (TW)

(72) Inventors: Tsung-Yao Wen, Hsinchu (TW); Angus Hsiao, Changhua County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/517,238

(22) Filed: Oct. 17, 2014

(65) Prior Publication Data

US 2016/0111286 A1    Apr. 21, 2016

(51) Int. Cl.
| | |
|---|---|
| H01L 21/02 | (2006.01) |
| H01L 21/033 | (2006.01) |
| H01L 21/308 | (2006.01) |
| H01L 21/8238 | (2006.01) |
| H01L 27/092 | (2006.01) |
| H01L 21/768 | (2006.01) |
| H01L 21/311 | (2006.01) |
| H01L 21/8258 | (2006.01) |

(52) U.S. Cl.
CPC ...... H01L 21/0338 (2013.01); H01L 21/3086 (2013.01); H01L 21/823807 (2013.01); H01L 21/823821 (2013.01); H01L 27/0924 (2013.01); *H01L 21/31144* (2013.01); *H01L 21/76816* (2013.01); *H01L 21/76877* (2013.01); *H01L 21/8258* (2013.01)

(58) Field of Classification Search
CPC ............ H01L 21/0337; H01L 21/3086; H01L 45/1691; H01L 21/0338; H01L 21/76816; H01L 21/28123; H01L 21/3088; H01L 21/76802; H01L 21/76838
See application file for complete search history.

(56) References Cited

U.S. PATENT DOCUMENTS

| | | | | |
|---|---|---|---|---|
| 9,735,160 | B2* | 8/2017 | Cheng | H01L 21/823814 |
| 2013/0001591 | A1* | 1/2013 | Wu | H01L 21/823821 |
| | | | | 257/77 |
| 2013/0122709 | A1* | 5/2013 | Liaw | H01L 21/0337 |
| | | | | 438/702 |
| 2014/0213033 | A1* | 7/2014 | Brunco | H01L 21/762 |
| | | | | 438/400 |
| 2015/0270341 | A1* | 9/2015 | Yin | H01L 29/66795 |
| | | | | 438/283 |
| 2015/0311121 | A1* | 10/2015 | Petrarca | H01L 21/823431 |
| | | | | 438/283 |
| 2015/0380258 | A1* | 12/2015 | Liu | H01L 29/785 |
| | | | | 257/192 |

* cited by examiner

*Primary Examiner* — David C Spalla
(74) *Attorney, Agent, or Firm* — Haynes and Boone, LLP

(57) ABSTRACT

A method of fabricating a semiconductor device is disclosed. The method includes forming a dielectric layer over a substrate, forming a hard mask (HM) layer over the dielectric layer, forming a fin trench through the HM layer and the dielectric layer and extending down to the substrate, forming a semiconductor feature in the fin trench and removing the HM layer to expose an upper portion of the semiconductor feature to form fin features.

20 Claims, 19 Drawing Sheets

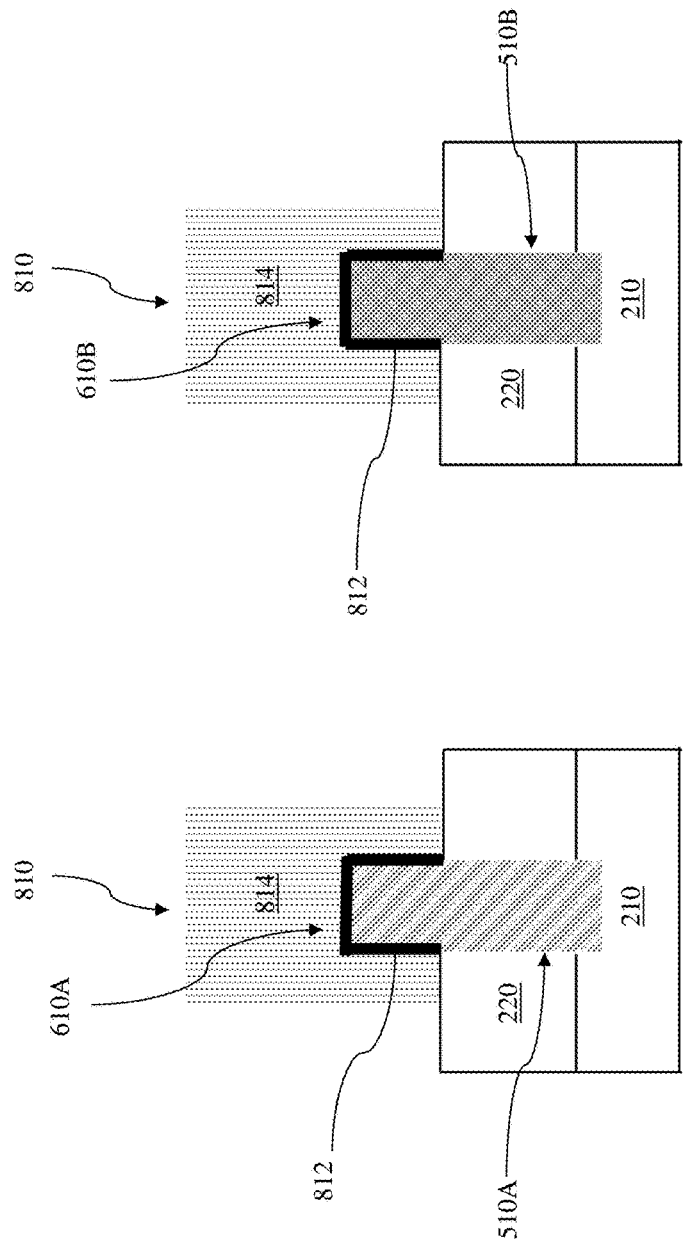

METHOD OF SEMICONDUCTOR DEVICE FABRICATION

BACKGROUND

The semiconductor integrated circuit (IC) industry has experienced rapid growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. Although existing methods of fabricating IC devices have been generally adequate for their intended purposes, they have not been entirely satisfactory in all respects. For example, a feasible method of forming small critical dimension features, such as fins, is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 12 to 17A-17B are cross-sectional views of an example semiconductor device in accordance with some embodiments.

DETAILED DESCRIPTION

Figure 1:
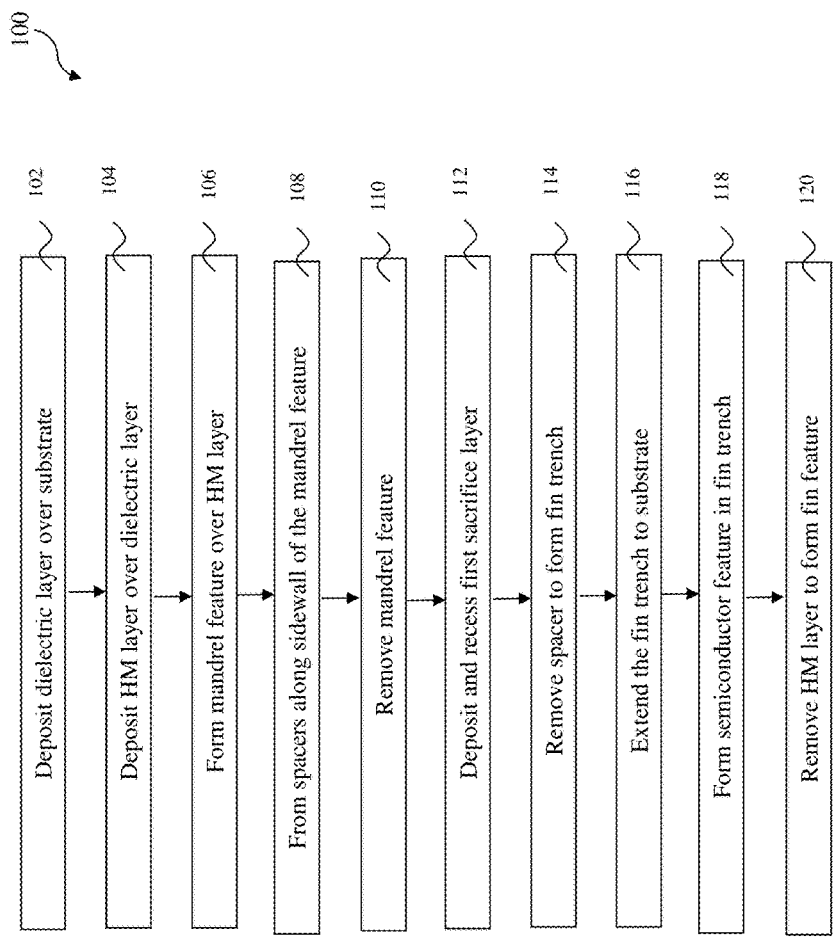
FIG. 1 is a flowchart of an example method for fabricating a semiconductor device constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below, with reference to a semiconductor device 200, shown in FIGS. 2-10.

Figure 2:
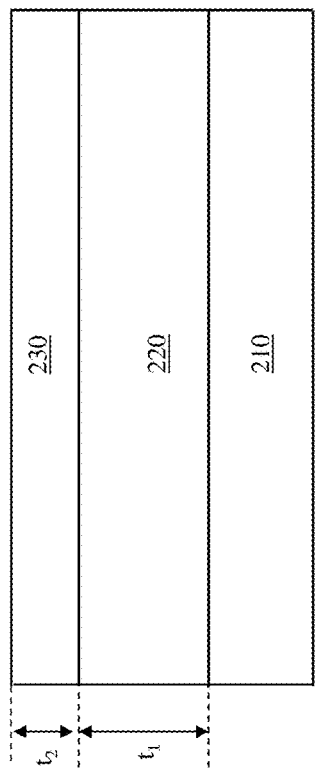
FIGS. 2 to 10 are cross-sectional views of an example semiconductor device in accordance with some embodiments.

Referring to FIGS. 1 and 2, the method 100 begins at step 102 by depositing a dielectric layer 220 over a substrate 210. The substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD) and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The dielectric layer 220 may include silicon oxide, silicon nitride, silicon oxynitride, and/or other suitable materials. In the present embodiment, the dielectric layer 220 is a material layer of an isolation feature such as shallow trench isolation (STI) feature, to be formed, which will be described in detail below. The dielectric layer 220 is deposited with a first thickness $t_1$, which is the thickness of the isolation feature to be formed. The dielectric layer 220 may be deposited by thermal oxidation chemical vapor deposition (CVD), atomic layer deposition (ALD), physical vapor deposition (PVD), thermal oxidation, combinations thereof, or other suitable techniques. In one embodiment, the dielectric layer 220 is a silicon oxide layer deposited by thermal oxidation. In the present embodiment, the substrate 210 has a quite flat topography for depositing the dielectric layer 220 and therefore the dielectric layer 220 is formed by a blanket-type deposition. In other words, there is no fin feature formed over the substrate 210 prior to the deposition of dielectric layer 220. The blanket-type deposition may relax process constrains, such as loading effect and high thermal budget, improve quality of the dielectric layer 220 for its isolation function and improve process control.

Referring again to FIGS. 1 and 2, the method 100 proceeds to step 104 by depositing a hard mask (HM) layer 230 over the dielectric layer 220, with a second thickness $t_2$. In the present embodiment, the second thickness $t_2$ will define a target height h of a fin feature to be formed. The HM layer 230 may include silicon oxide, silicon nitride, oxynitride, silicon carbide, titanium oxide, titanium nitride, tantalum oxide, tantalum nitride, and/or any suitable materials. In the present embodiment, the HM layer 230 includes a material which is different from the dielectric layer 220 to achieve etching selectivity in subsequent etches. The HM layer 230 may include multiple layers. For example, the HM layer 230 includes a SiN layer over a SiCN layer to gain process flexibility and process control in subsequent processes. The HM layer 230 may be deposited by a suitable technique, such as CVD, PVD, ALD, spin-on coating, and/or other suitable technique.

Figure 3:
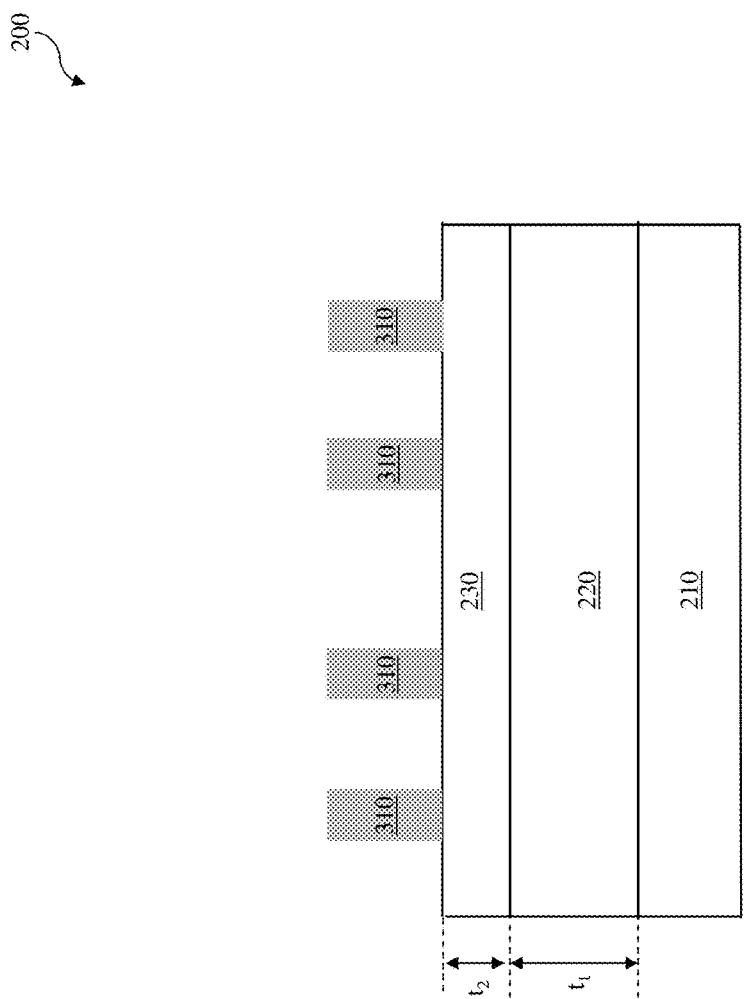

Referring to FIGS. 1 and 3, the method 100 proceeds to step 106 by forming mandrel features 310, having a first width $w_1$, over the HM layer 230. In one embodiment, the mandrel features 310 are formed by depositing a mandrel material layer, such as a polysilicon layer over HM layer 230. The mandrel material may be deposited by various methods, including CVD, ALD, and/or other methods known in the art. Then a photolithography process is applied which includes forming a photoresist layer (resist), exposing the resist to a pattern, performing a post-exposure bake process, and developing the resist to form a masking element including the resist. The masking element is then used to etch the mandrel material to form the mandrel feature 310. The etching process includes a wet etch, a dry etch, and/or a combination thereof.

Figure 4:
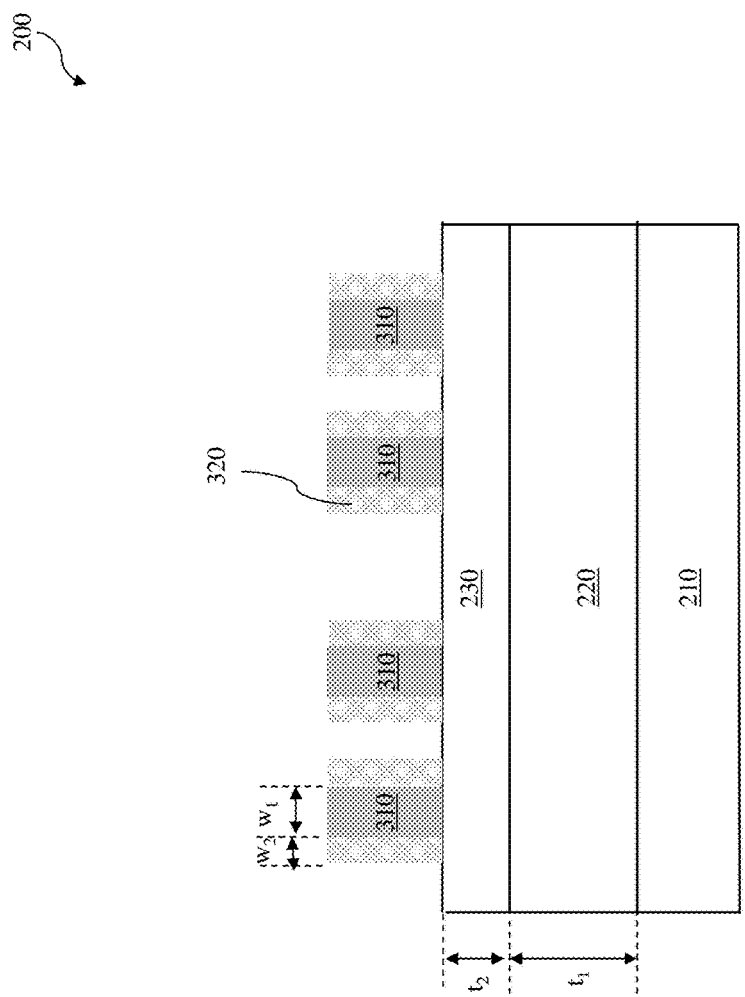

Referring to FIGS. 1 and 4, the method 100 proceeds to step 108 by forming spacers 320 along sidewalls of the mandrel features 310. In the present embodiment, the spacers 320 include a material which is different from the mandrel features 310 to achieve etching selectivity subsequent etch. The spacers 320 may be formed by depositing a spacer layer over the mandrel features 310, and followed by a spacer etch to etch the spacer layer anisotropically. The spacer layer may include silicon oxide, silicon nitride, oxynitride, silicon carbide, titanium oxide, titanium nitride, tantalum oxide, tantalum nitride, or any suitable materials. The spacer layer may be deposited by CVD, ALD, PVD, or other suitable techniques. In one embodiment, the spacer layer is deposited by ALD to achieve conformable film coverage along the sidewalls of the mandrel feature 310. In one embodiment, the spacer layer is etched by an anisotropic dry etch to form a vertical profile, which will be transferred to a profile of a fin feature later. By controlling the thickness of the spacer layer and spacer etching process, the spacers 320 are formed to have a second width $w_2$, which will be a width of a fin feature to be formed. In one embodiment, the second width $w_2$ is smaller than the first width $w_1$.

Figure 5:
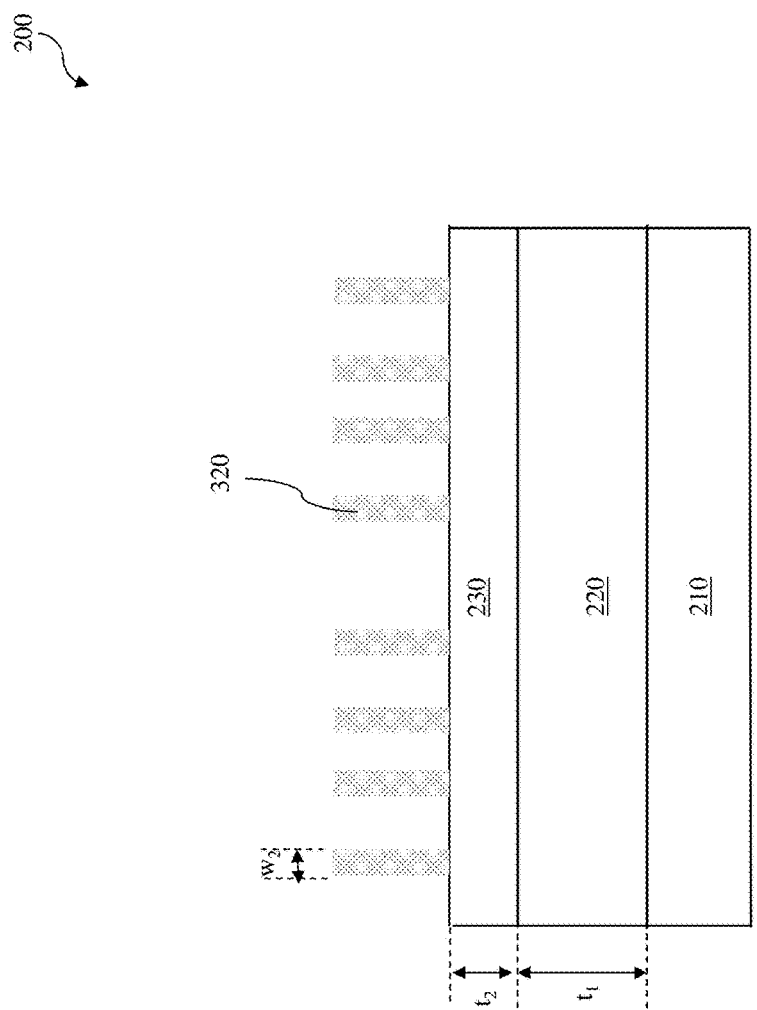

Referring to FIGS. 1 and 5, the method 100 proceeds to step 110 by removing the mandrel features 310 while the spacers 320 remain intact. As has been mentioned previously, the etch process is properly chosen to selectively remove the mandrel feature 310, but does not substantially etch the spacers 320. The selective etch may include a selective wet etch, a selective dry etch, and/or a combination thereof.

Figure 6:
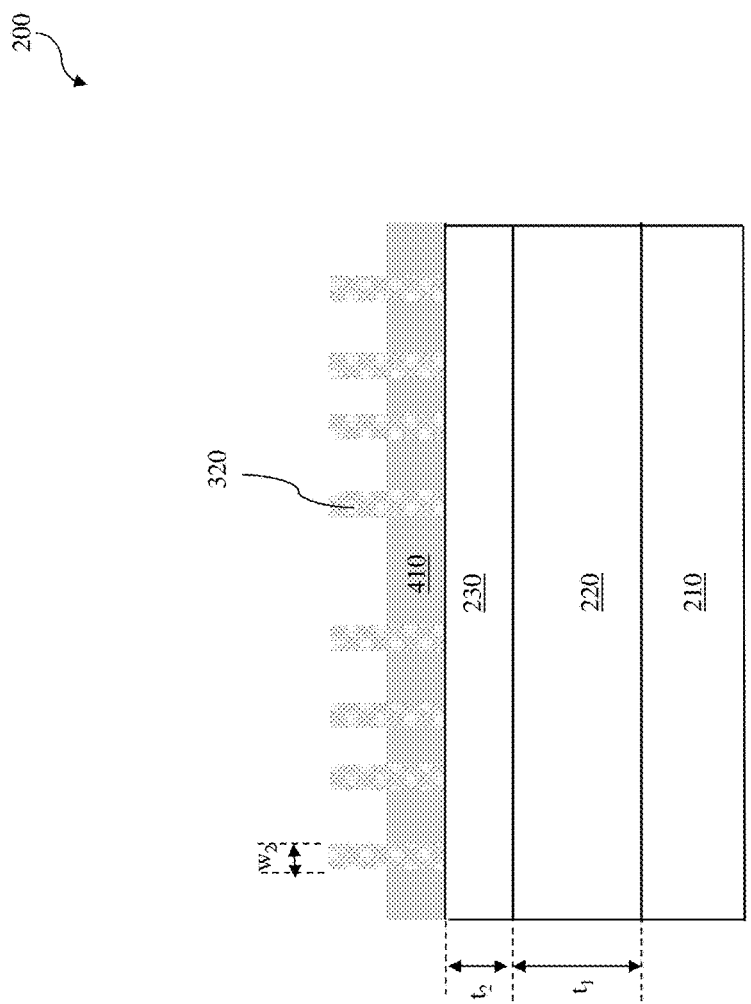

Referring to FIGS. 1 and 6, the method 100 proceeds to step 112 by depositing a first sacrificial layer 410 and etching back the first sacrificial layer 410 to expose an upper portion of the spacers 320. The first sacrificial layer 410 may include photoresist, silicon oxide, silicon nitride, oxynitride, silicon carbide, and/or other suitable materials. In one embodiment, the first sacrificial layer 410 includes a material which is different from the spacers 320 and the HM layer 230 to achieve etching selectivity subsequent etches. The first sacrificial layer 410 may be deposited by CVD, PVD, ALD, spin-on coating, or other suitable techniques. In the one embodiment, the first sacrificial layer 410 is then etched back by etching process such as a wet etch, a dry etch, or a combination thereof. In one embodiment, the first sacrificial layer 410 is a photoresist layer and it is etching back by a plasma dry etching process.

Figure 7:
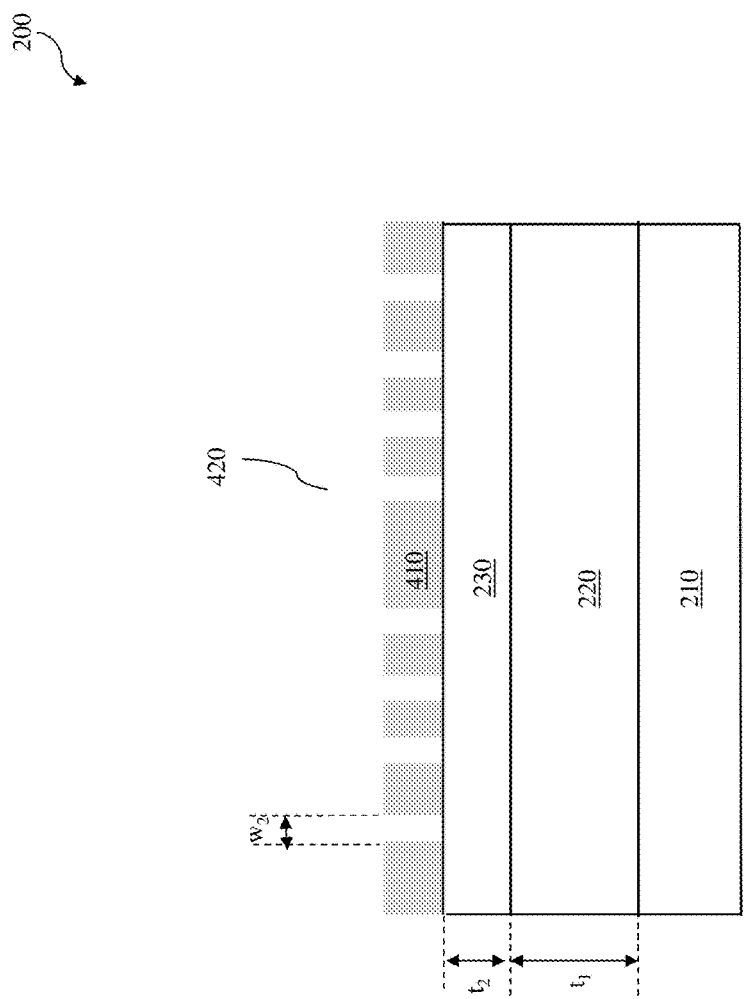

Referring to FIGS. 1 and 7, the method 100 proceeds to step 114 by removing the spacers 320 using the sacrificial layer 410 as an etch mask to thereby form openings 420. The etch process is properly chosen to selectively remove the spacers 320, but does not substantially etch the sacrificial layer 410. Therefore the opening 420 carries the second width $w_2$. In the present embodiment, the etch process includes an anisotropic etch. For example, the etch process is a plasma anisotropic etch. As has been mentioned previously, with an adequate etch selectivity, the HM layer 230 serves as an etch stop layer during the etch process, which improves etch process window and the opening 420 profile control. The HM layer 230 is exposed in the opening 420.

Figure 8:
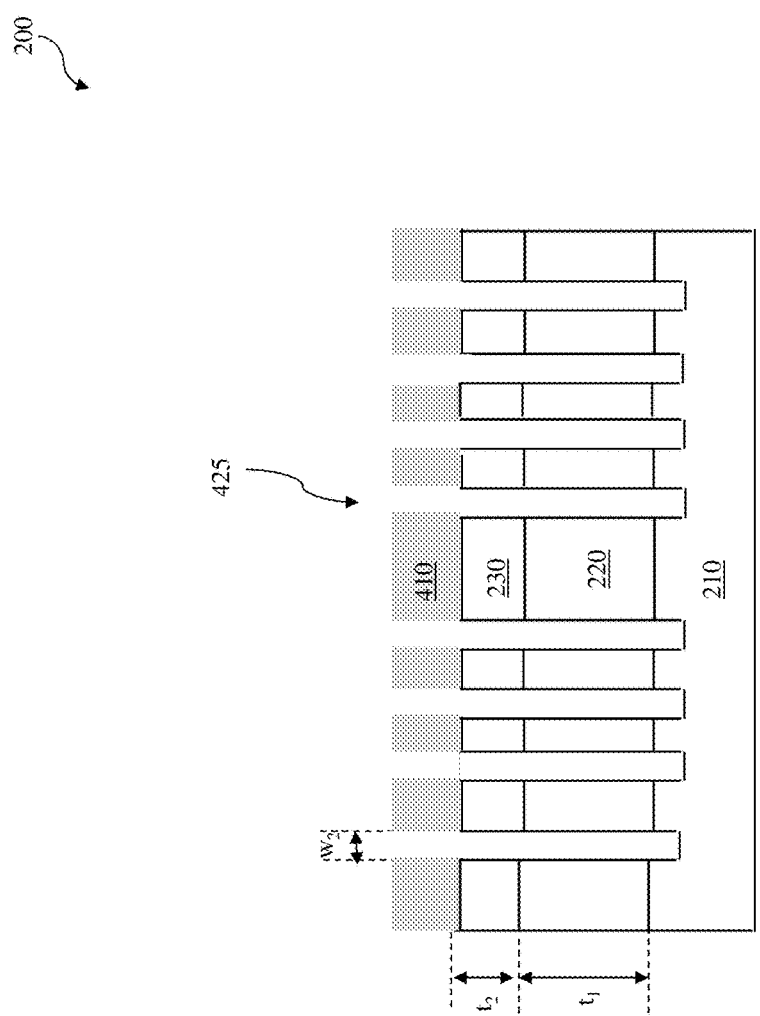

Referring to FIGS. 1 and 8, the method 100 proceeds to step 116 by forming and extending fin trench 425 by using the first sacrificial layer 410 serves as an etch mask. The HM layer 230 and the dielectric layer 220 are etched through the opening 420 and the etching extends fin trench 425 at least to substrate 210. As shown, fin trench 425 extends into a portion of substrate 425. Thereafter, first sacrificial layer 410 is removed by another etching process, such as a plasma strip process.

In the present embodiment, the etch process to form fin trench 425 includes an anisotropic etch, such as a plasma anisotropic etch. Accordingly, the fin trenches 425 are formed continually with vertical profiles and carry the second width $w_2$. Therefore, in the present embodiment, the width of the fin trench 425 is defined by deposition and etching processes, instead of a lithography process. Because opening 420 was created without performing a lithography process (i.e. opening 420 was created through deposition of first sacrificial layer 410 and subsequent etching of spacers 320), fin trench 425 is formed with more relaxed constraints as compared to a traditional lithography process to form opening 420.

Referring to FIGS. 1 and 9A-9C, the method 100 proceeds to step 118 by forming semiconductor features 510 in the fin trenches 425. The semiconductor features 510 are formed by filling in the fin trench 425 with a semiconductor material layer and then recessing the semiconductor material layer. The semiconductor material layer may be deposited by epitaxial growing processes, such as CVD deposition techniques (e.g., vapor-phase epitaxy (VPE) and/or ultra-high vacuum CVD (UHV-CVD)), molecular beam epitaxy, and/or other suitable processes.

The semiconductor device 200 may have a first region 520 and a second region 530. For an example, the first region 520 is an n-type field-effect transistor (NFET) region and the second region 530 is a p-type FET (PFET) region. Different semiconductor features 510 may be needed in the first region 520 from the semiconductor feature 510 in the second region 530. For the sake of clarity to better illustration of concepts of the present disclosure, the semiconductor feature 510 in the first region 520 are referred to as a first semiconductor feature 510A and the semiconductor feature 510 in the second region 530 are referred to as a second semiconductor feature 510B.

Figure 9A:
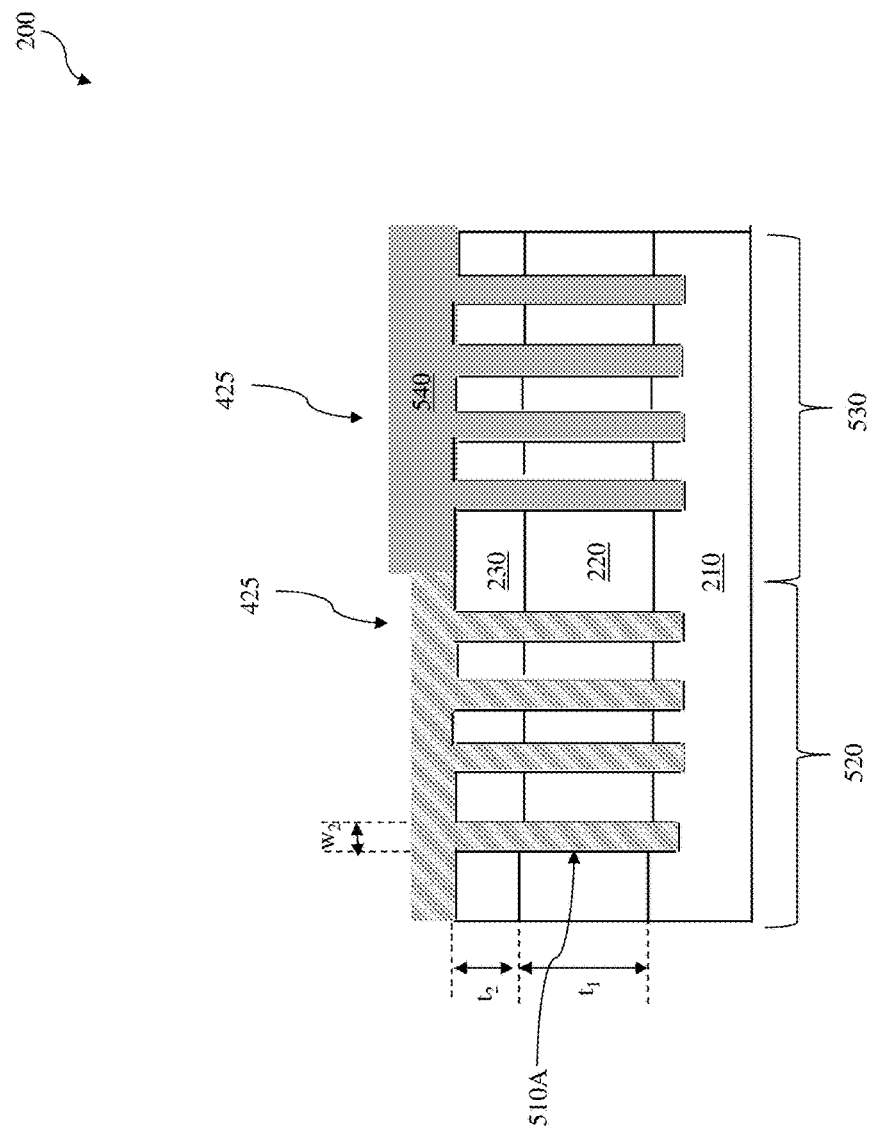
Figure 9B:
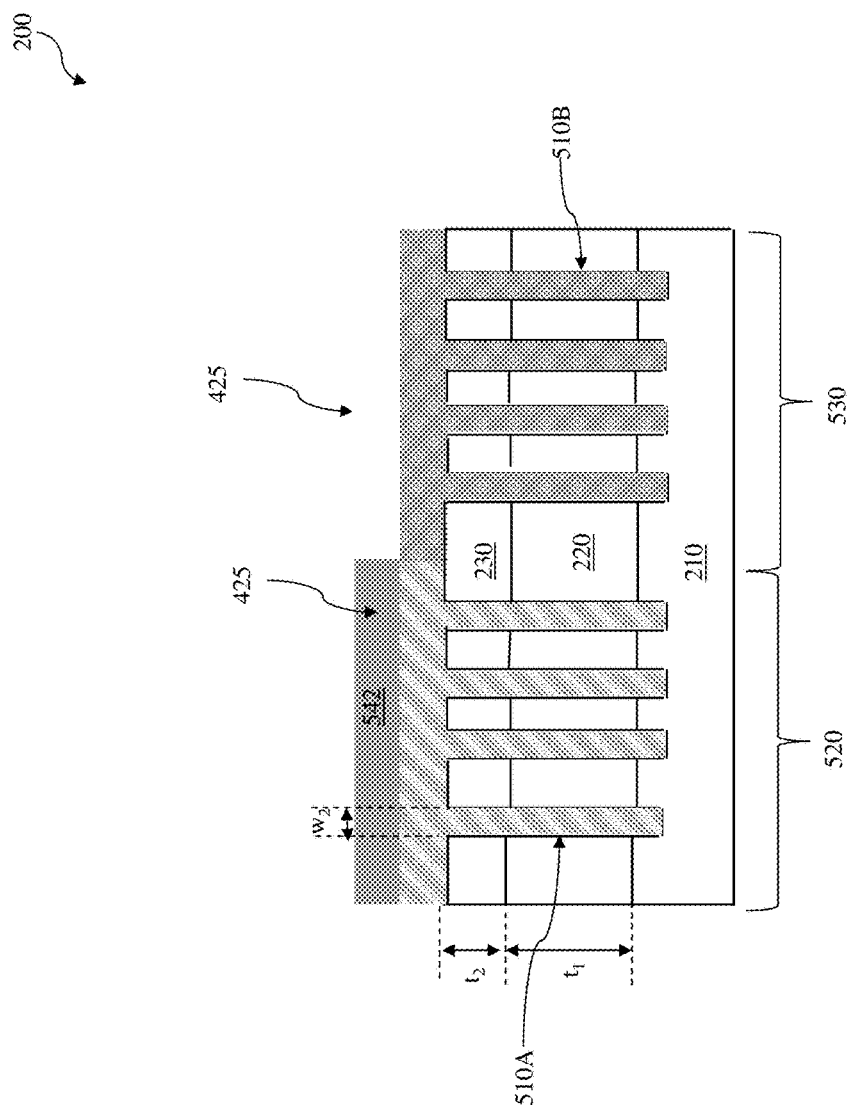
Figure 9C:
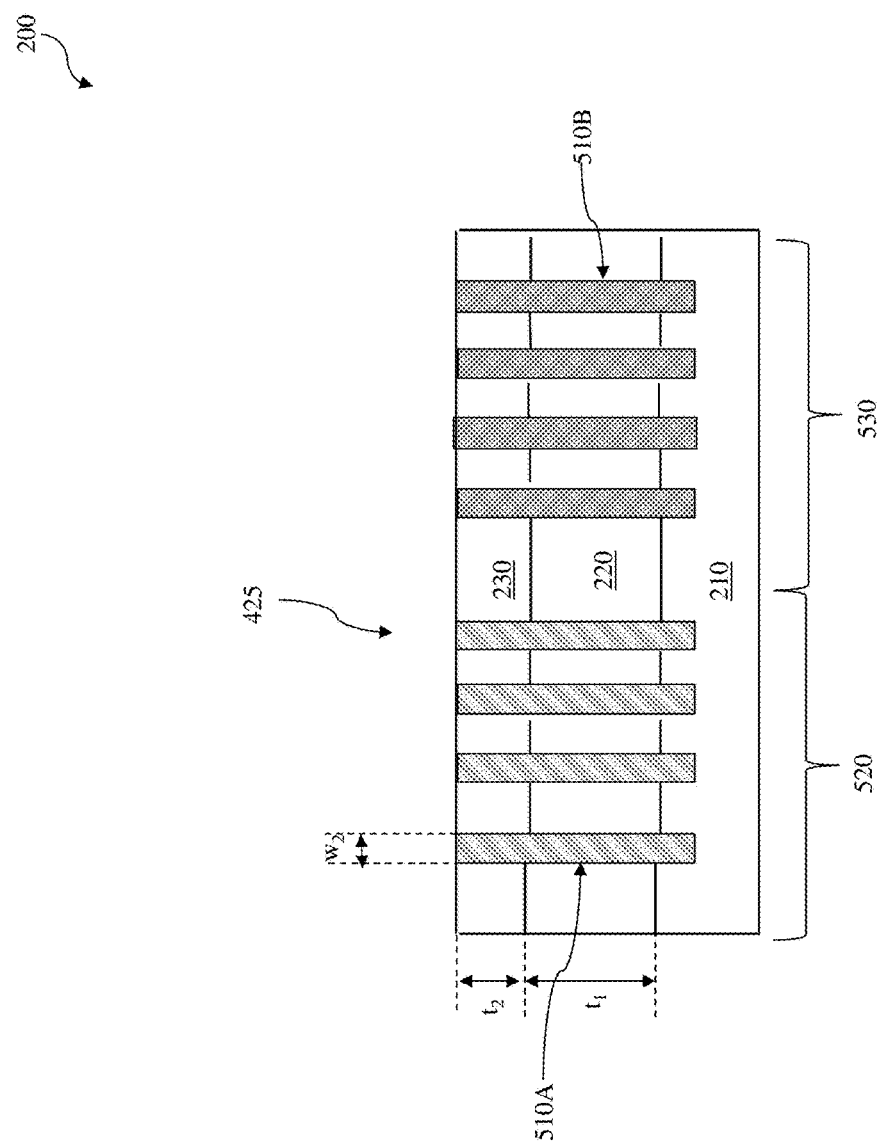

The first semiconductor material layer fills in the fin trenches 425 in the first region 520 while the second region 530 is covered by a first patterned hard mask (as shown in FIG. 9A). The first patterned hard mask may include a patterned photoresist layer 540 and it is removed after depositing the first semiconductor material layer. Then the second semiconductor material layer fills in the fin trenches 425 in the second region 530 while the first region 520 is covered by a second patterned hard mask 542 (as shown in FIG. 9B). The second patented hard mask is then removed after depositing the second semiconductor material layer. A chemical mechanical polishing (CMP) process may be performed to recess excessive the first and second semiconductor material layers to form the first and second semiconductor features, 510A and 510B, in the fin trenches 425 (as shown in FIG. 9C). In one embodiment, both of the first and second semiconductor features, 510A and 510B, directly contact the substrate 210.

The first and second semiconductor features, 510A and 510B, may include germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), or other suitable materials. The first and second semiconductor features, 510A and 510B, may include stacks of multiple layers. In one embodiment, the first semiconductor feature 510A (for an NFET) includes (from bottom layer to top layer) a strain-relaxed buffer (SRB) buried-SiGe layer/tensile Si layer, while the second semiconductor feature 510B (for a PFET) includes (from bottom layer to top layer) an epitaxially grown Ge layer/an epitaxially grown SiGe layer.

Figure 10:
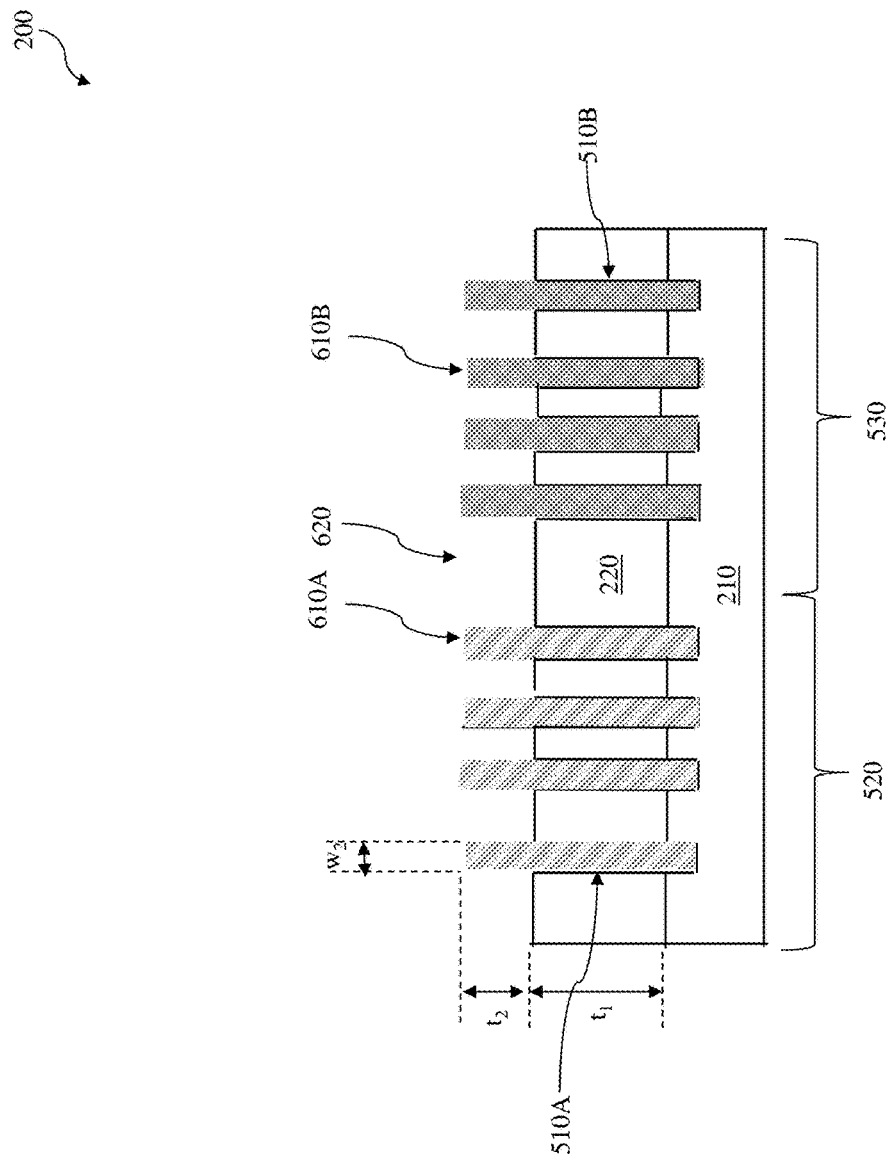

Referring to FIGS. 1 and 10, the method 100 proceeds to step 120 by removing the HM layer 230 and exposing upper portions of the first and second semiconductor features, 510A and 510B to form first fin feature 610A in the first region 520 and second fin features 610B in the second region 530. As has been mentioned previously, in the present embodiment, the HM layer 230 is removed by a selective etching process, which does not substantially etch the dielectric layer 220. Thus respective upper portions of the first and second semiconductor material layers, 510A and 510B, are exposed, which are referred to as the first and the second fin features, 610A and 610B, respectively. As mentioned previously, the first and second fin features, 610A and 610B, have a width of the second width $w_2$, a height of the second thickness $t_2$. The dielectric layer 220 between each of first and second semiconductor features, 510A and 510B form isolation region 620, which electrically isolate the various regions.

Therefore, in the present embodiment, the first and second fin features, 610A and 610B, are formed after formation of the dielectric layer 220 (the isolation region 620), which not only avoids adverse impacts on the first and second fin features, 610A and 610B, during forming the isolation region 620, but also avoids adverse impacts on the isolation region 620 during formation of the first and second fin features, 610A and 610B. It is referred to as isolation region-first/fin feature-last scheme. With isolation region-first/fin features-last scheme, the fin feature may avoid experiencing high thermal budget process. Therefore, stress relaxation in the fin feature is reduced and a strain level of the fin feature is maintained. Also, in the present embodiment, the width of the first and second fin features, 610A and 610B, is defined by deposition and etch processes and the height of the first and second fin features, 610A and 610B, is controlled by the thickness of the HM layer.

Figure 11:
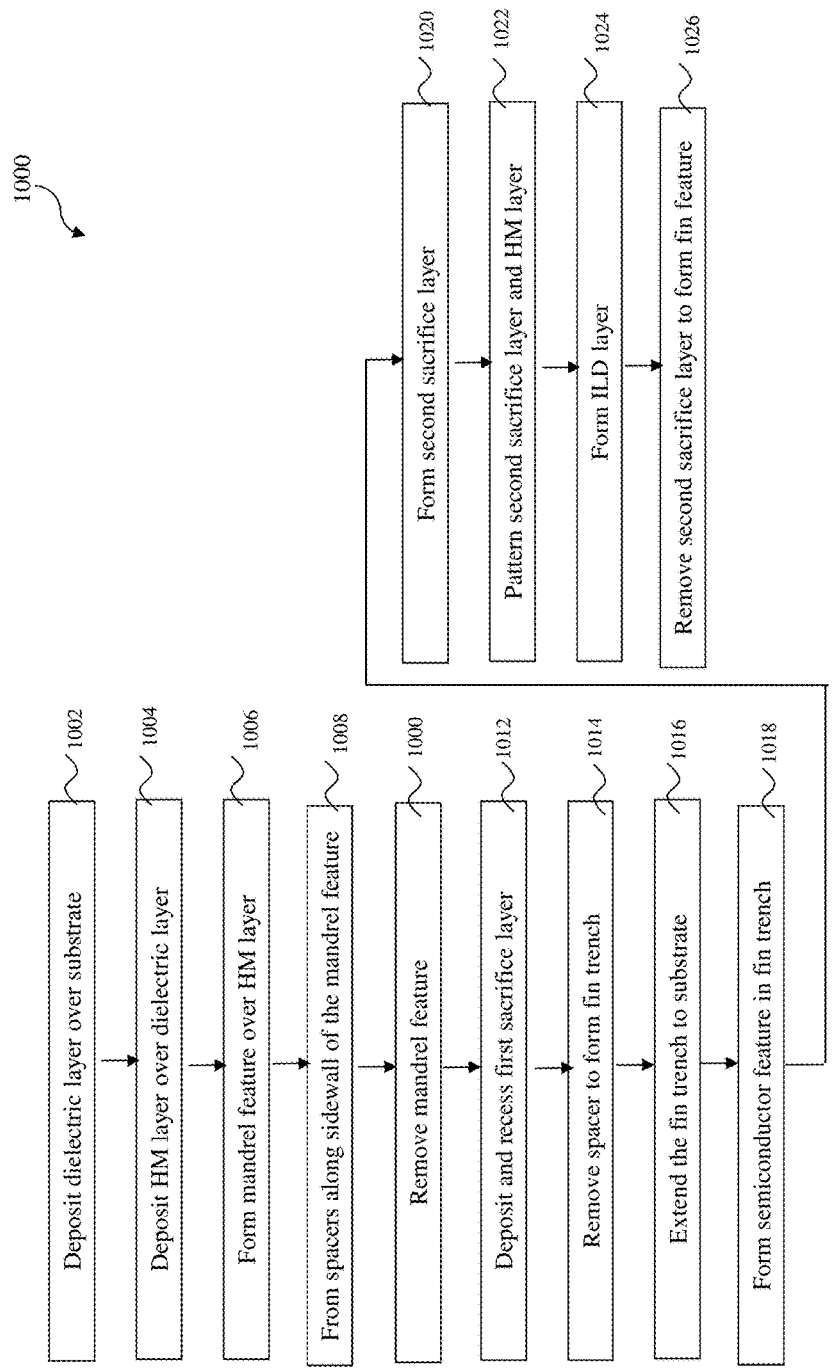
FIG. 11 is a flow chart of an example method for fabricating a semiconductor device in accordance with some embodiments.

FIG. 11 is a flowchart of another example method 1000 for fabricating a semiconductor device 2000. The first nine steps of the method 1000, 1002, 1004, 1006, 1008, 1010, 1012, 1014, 1016 and 1018, are similar to those discussed above in steps 102, 104, 106, 108, 110, 112, 114, 116 and 118, respectively, of the method 100. Thus, the discussion above with respect to steps 102, 104, 106, 108, 110, 112, 114, 116 and 118 is applicable to the steps 1002, 1004, 1006, 1008, 1010, 1012, 1014 1016 and 1018, respectively. The present disclosure repeats reference numerals and/or letters in the various embodiments. This repetition is for the purpose of simplicity and clarity such that repeated reference numerals and/or letters indicate similar features amongst the various embodiments unless stated otherwise.

Figure 12:
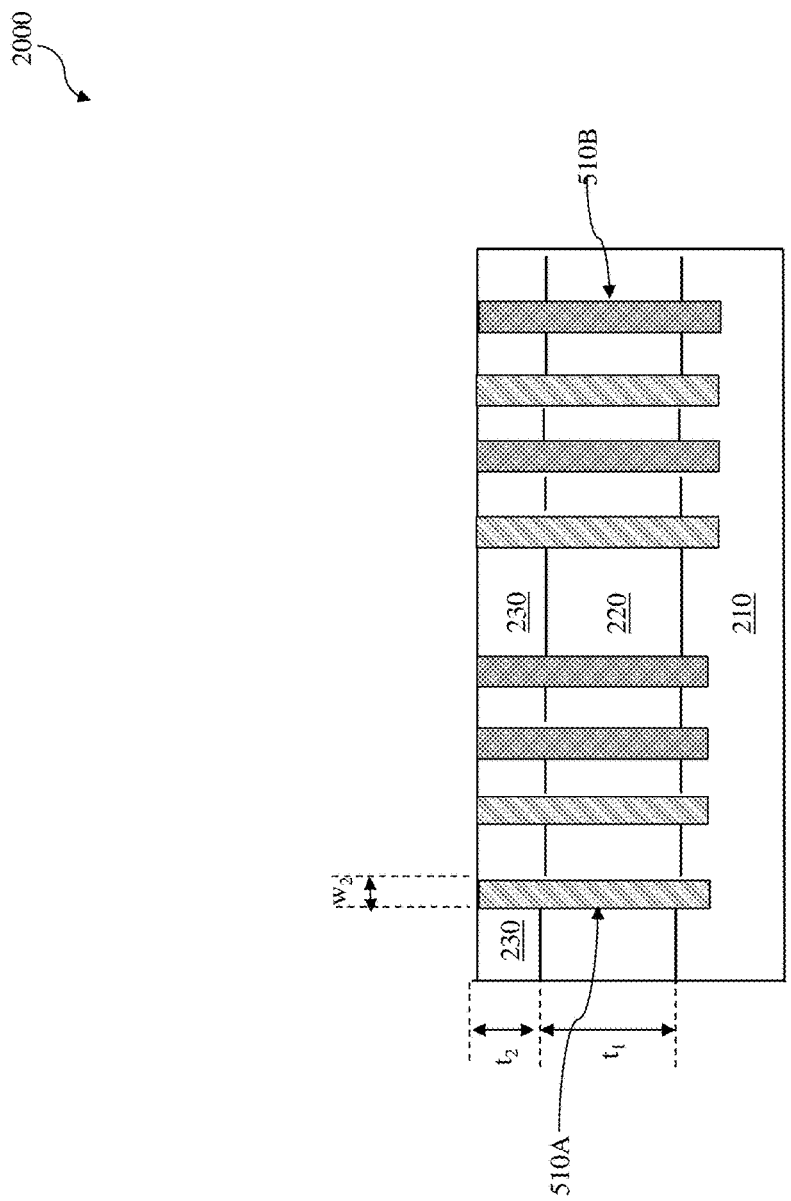

FIG. 12 illustrates the first and second semiconductor features, 510A and 510B, are formed over the substrate 210 at the step 1018 of the method 1000.

Figure 13:
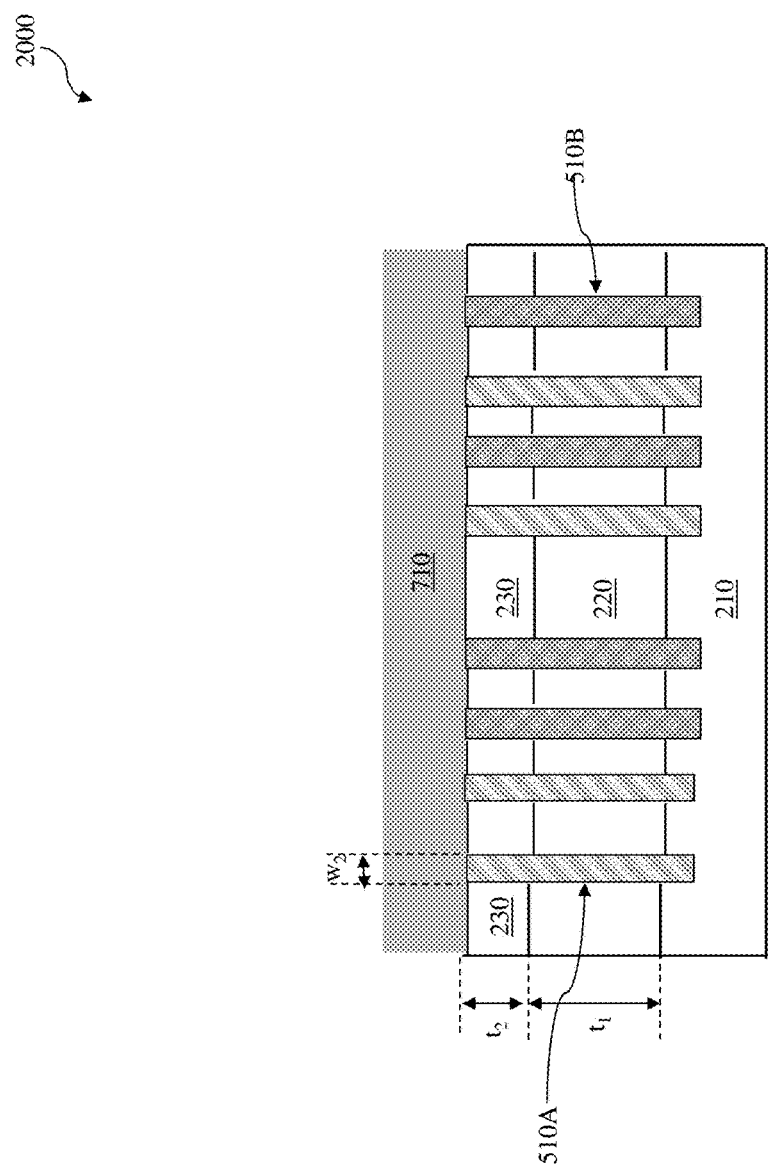

Referring to FIGS. 11 and 13, the method 1000 proceeds to step 1020 by forming a second sacrificial layer 710 over the HM layer 230 and the semiconductor features, 510A and 510B. The second sacrificial layer 710 may include poly silicon, or other suitable materials. The second sacrificial layer 710 may be deposited by CVD, ALD, PVD, spin-on coating, or other suitable processes. In the present embodiment, the recessing process (such as CMP) is performed in the previous step and it leaves a quite flat surface for forming the second sacrificial layer 710.

Figure 14:
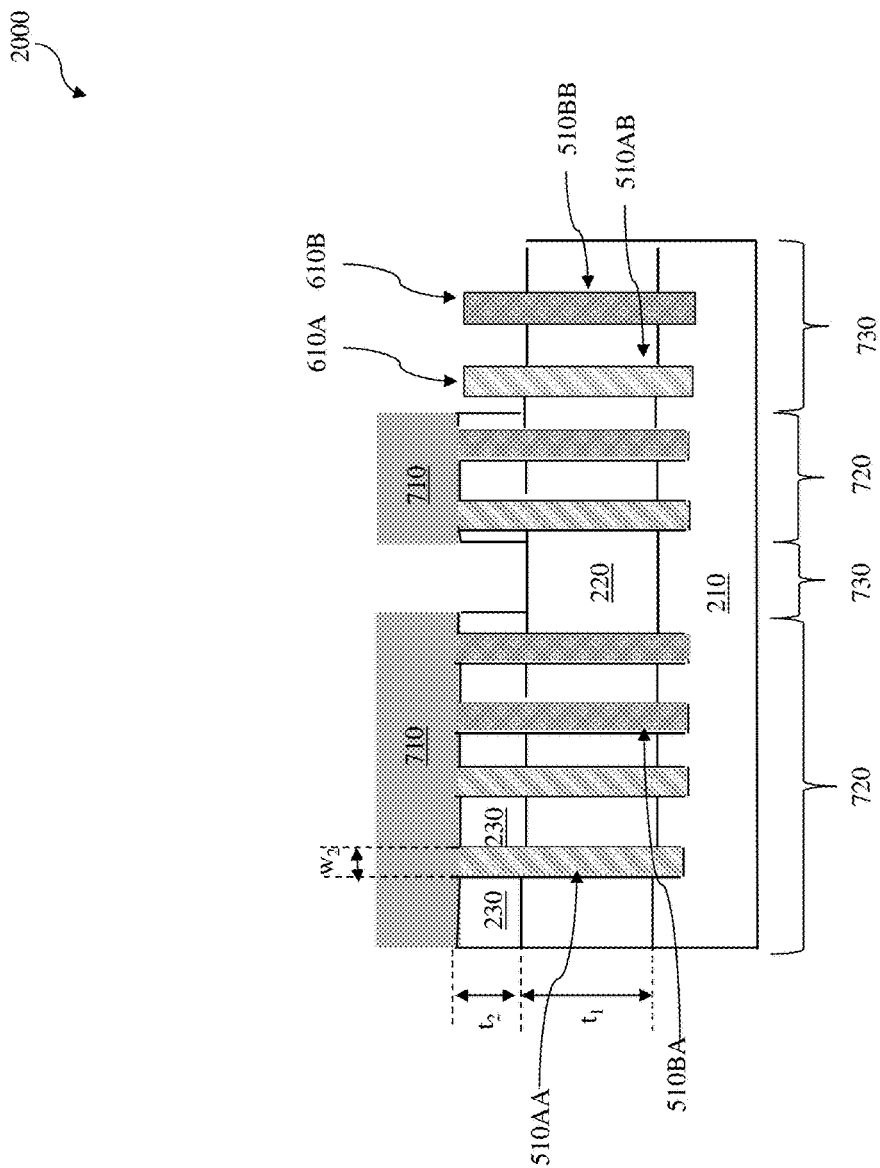

Referring to FIGS. 11 and 14, the method 1000 proceeds to step 1022 by patterning the second sacrificial layer 710 and the HM layer 230. The second sacrificial layer 710 and the HM layer 230 are patterned by photolithography patterning and etching processes. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods. As has been mentioned in the previous step, the second sacrificial layer 710 (the dummy gate stack) is formed with a quite flat surface and it carries a flat topography.

In present embodiment, the second sacrificial layer 710 and the HM layer 230 are patterned such that they remain in a third region 720 while they are removed from a fourth region 730. In one embodiment, the patterned second sacrificial layer 710 includes patterned poly silicon layer and is referred to as dummy gate stacks 710. The third and fourth regions, 720 and 730, may include first and second subsets of the first and second semiconductor feature 510A and 510B. For the sake of clarity to better illustration of concepts of the present disclosure, the first subset of the first and second semiconductor features, 510A and 510B, in the third region 720, are referred to as 510AA and 510BA, respectively; and the second subset of the first and second semiconductor features, 510A and 510B in the fourth region 730, are referred to as 510AB and 510BB, respectively. In the fourth region 730, after removing the patterned second sacrificial layer 710 and the HM layer 230, the upper portion of the second subset of the first or second semiconductor features, 510AB and 510BB, are exposed, which form the first and second fin features, 610A and 610B, respectively. The dielectric layer 220 is exposed in the fourth region 730 as well.

Figure 15:
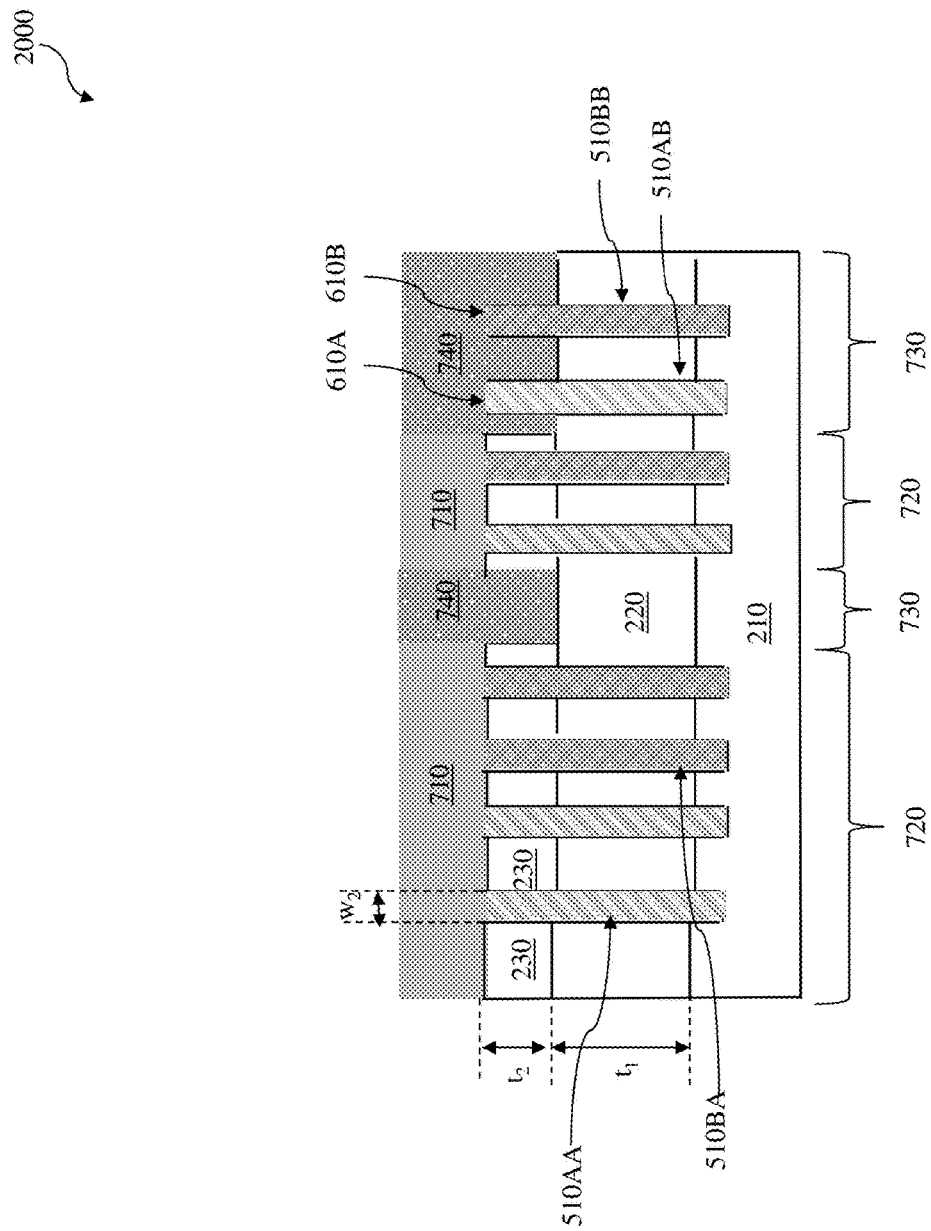

Referring to FIGS. 11 and 15, the method 1000 proceeds to step 1024 by forming an interlayer dielectric (ILD) layer 740 over the substrate 210, including filling in spaces between two adjacent fin features, 610A and 610B, in the fourth region 730. The ILD layer 740 may include silicon oxide, oxynitride or other suitable materials. The ILD layer 740 may include a single layer or multiple layers. The ILD layer 740 is formed by a suitable technique, such as CVD, ALD and spin-on (SOG). A CMP process may be performed to remove excessive ILD layer 740 and planarize the top surface of the ILD layer 740 with the patterned second sacrificial layer 710.

Figure 16:
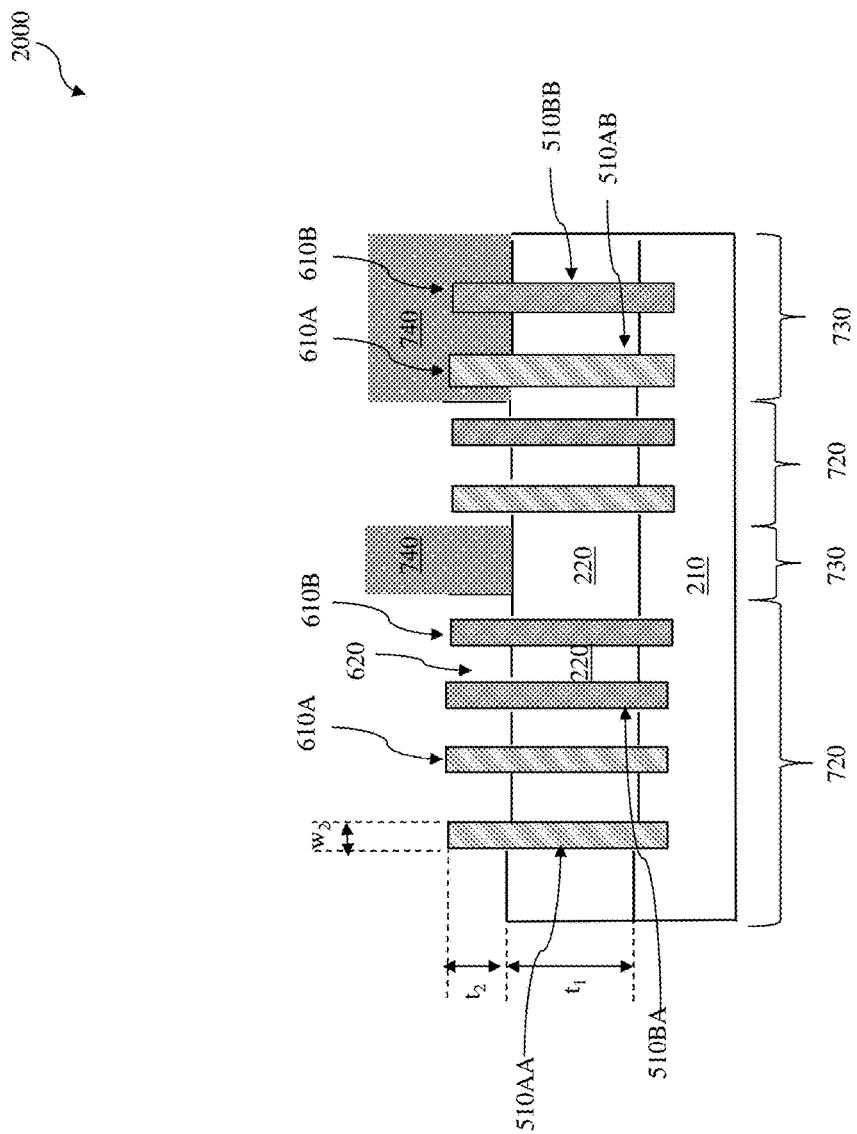

Referring to FIGS. 11 and 16, the method 1000 proceeds to step 1026 by removing the second sacrificial layer 710 and the HM layer 230 to form the first and second fin features, 610A and 620A, in the third region 720. At the meantime, the dielectric layer 220, between each of first and second semiconductor features, 510A and 510B, form isolation region 620, which electrically isolate the various regions. In the present embodiment, the patterned second sacrificial layer 710 is removed by a selective etch, which does not substantially etch the ILD layer 740. In one embodiment, the dummy gate stack 710 is removed a selective wet etch or a selective dry etch. A wet etching solution includes a tetramethylammonium hydroxide (TMAH), a HF/HNO$_3$/CH$_3$COOH solution, or other suitable solution. Dry etching processes include a biased plasma etching process that uses a chlorine-based chemistry. Other dry etchant gasses include CF$_4$, NF$_3$, SF$_6$, and He. Dry etching may also be performed anisotropically using such mechanisms as DRIE (deep reactive-ion etching).

Therefore, in the present embodiment of the method 1000, the first and second fin features, 610A and 610B, are formed after formation of the dielectric layer 220 (becoming the isolation region 620) and after forming the dummy gate stack 710, which avoid adverse impacts on the first and second fin features, 610A and 610B, during forming the isolation region 620 and forming/removing dummy gate stack 710. It is referred to as isolation-region-first & dummy-gate-first/fin-feature-last scheme. With isolation region-first&dummy-gate-first/fin features-last scheme, the fin feature may avoid experiencing high thermal budget process. Therefore, stress relaxation in the fin feature is reduced and a strain level of the fin feature is maintained.

Additional steps can be provided before, during, and after the method 100 or 1000, and some of the steps described can be replaced or eliminated for other embodiments of the method.

For example high-k/metal gates (HK/MG) 810 are formed over the substrate, including wrapping over the first and second fin features, 610A and 610B, as showed in FIGS. 17A and 17B. The HK dielectric layer 812 may include LaO, AlO, ZrO, TiO, Ta$_2$O$_5$, Y$_2$O$_3$, SrTiO$_3$ (STO), BaTiO$_3$ (BTO), BaZrO, HfZrO, HfLaO, HfSiO, LaSiO, AlSiO, HfTaO, HfTiO, (Ba,Sr)TiO$_3$ (BST), Al$_2$O$_3$, Si$_3$N$_4$, oxynitrides (SiON), and/or other suitable materials. The HK dielectric layer 812 is deposited by a suitable technique, such as ALD, CVD, metal-organic CVD (MOCVD), physical vapor deposition (PVD), other suitable technique, or a combination thereof. The MG 814 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG 814 may include Ti, Ag, Al, TiAlN, TaC, TaCN, TaSiN, Mn, Zr, TiN, TaN, Ru, Mo, Al, WN, Cu, W, any suitable materials or a combination thereof. The MG may be formed by ALD, PVD, CVD, or other suitable process.

Based on the above, the present disclosure offers methods for fabricating a semiconductor device. The method employs a scheme of isolation-region-first/fin-feature-last, and a scheme of isolation-region-first & dummy-gate-first/fin-feature-last scheme, which avoid adverse impacts between the isolation region and fin feature to each other during their formations. The scheme of isolation region-first/fin feature-last prevents fin features from experiencing high thermal budget process. Thus stress relaxation in the fin feature is reduced and strain level of the fin feature is maintained. The method demonstrates improving control of the fin feature width and height, improving quality of the isolation region and low thermal budget. The method also provides forming dummy gate stack inherited a flat top surface, which achieves process simplicity. The method also provides defending a small dimension of fin feature by deposition and etch processes, which relax lithography process constrains.

The present disclosure provides many different embodiments of fabricating a semiconductor device that provide one or more improvements over other existing approaches. In one embodiment, a method includes depositing a dielectric layer over a substrate, depositing a hard mask (HM) layer over the dielectric layer, forming a fin trench through the HM layer and the dielectric layer and extending down to the substrate, forming a semiconductor feature in the fin trench and removing the HM layer to expose an upper portion of the semiconductor feature to form fin features.

In another embodiment, a method for fabricating a semiconductor device includes depositing a dielectric layer over a substrate, depositing a hard mask (HM) layer over the dielectric layer, forming a fin trench through the HM layer and the dielectric layer and extending down to the substrate, forming a semiconductor feature in the fin trench, wherein a top surface of the semiconductor feature is planar with a top surface of the HM layer, forming a sacrificial layer over the semiconductor feature and the HM layer, removing the sacrificial layer and the HM layer in a first region to expose a first subset of the semiconductor feature and the dielectric layer. The sacrificial layer covers a second subset of the semiconductor feature and the HM layer in a second region. The method also includes forming an interlayer dielectric (ILD) layer over the first subset of the semiconductor features and the exposed dielectric layer in the first region and removing the sacrificial layer and the HM layer in the second region to expose upper portions of the second subset of the semiconductor features to form fin features.

In yet another embodiment, a method for fabricating a semiconductor IC includes depositing a dielectric layer over a substrate, depositing a hard mask (HM) layer over the dielectric layer, forming a mandrel feature over the HM layer, forming the spacer along sidewall of the mandrel feature, selectively removing the mandrel feature, depositing the sacrificial layer over the spacer; etching back the sacrificial layer to expose the spacer, selectively removing the spacer to form an opening in the sacrificial layer, etching the HM layer and dielectric layer through the opening and extending etching down to the substrate to form a fin trench, forming a semiconductor feature in the fin trench and removing the HM layer to expose an upper portion of the semiconductor feature to form fin features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, the method comprising:
   depositing a dielectric layer having a first thickness directly on a substrate, wherein the first thickness defines a target isolation feature thickness;
   depositing a hard mask (HM) layer having a second thickness directly on the dielectric layer, wherein the second thickness defines a target fin feature height;
   forming a first fin trench and a second fin trench that extend through the HM layer and the dielectric layer to expose the substrate;
   forming a first masking layer that covers a first region of the HM layer that includes the second fin trench, wherein the first masking layer fills the second fin trench;
   forming a first semiconductor material that covers at least a portion of a second region of the HM layer that includes the first fin trench, wherein the first semiconductor material fills the first fin trench;
   forming a second masking layer that covers the first semiconductor material and the second region of the HM layer;
   after removing the first masking layer, forming a second semiconductor material that covers at least a portion of the first region of the HM layer that includes the second fin trench, wherein the second semiconductor material fills the second fin trench and the second semiconductor material is different than the first semiconductor material;
   after removing the second masking layer, performing a planarization process that removes the first semiconductor material and the second semiconductor material covering the HM layer, thereby forming a first fin feature having the target fin feature height and a second fin feature having the target fin feature height; and
   removing the HM layer to expose an upper portion of the first fin feature and an upper portion of the second fin feature, wherein a height of the upper portion of the first fin feature and a height of the upper portion of the second fin feature are substantially equal to the second thickness and a portion of the dielectric layer defines a first isolation feature having the isolation feature target thickness adjacent to the first fin feature and a second isolation feature having the isolation feature target thickness adjacent to the second fin feature.

2. The method of claim 1, wherein the target fin feature height is greater than the first thickness.

3. The method of claim 1, wherein the forming the first masking layer includes forming a first patterned resist layer and the forming the second masking layer includes forming a second patterned resist layer.

4. The method of claim 1, wherein the forming the first fin trench and the second fin trench includes:
   forming a sacrificial layer directly on the HM layer, wherein the sacrificial layer includes a first opening defining a first fin feature target width for the first fin feature and a second opening defining a second fin feature target width for the second fin feature; and
   etching the HM layer and dielectric layer exposed by the first opening and the second opening.

5. The method of claim 4, wherein the forming the sacrificial layer directly on the HM layer includes:
   forming a first spacer and a second spacer directly on the HM layer, wherein a width of the first spacer is substantially equal to the first fin feature target width and a width of the second spacer is substantially equal to the second fin feature target width;
   depositing the sacrificial layer directly on the HM layer, wherein the sacrificial layer covers the first spacer and the second spacer;
   etching back the sacrificial layer to expose the first spacer and the second spacer; and
   selectively removing the first spacer and the second spacer, thereby forming the first opening and the second opening in the sacrificial layer.

6. The method of claim 5, wherein the forming the first spacer and the second spacer directly on the HM layer includes:
   forming a first mandrel feature and a second mandrel feature directly on the HM layer;
   forming the first spacer along a sidewall of the first mandrel feature and the second spacer along a sidewall of the second mandrel feature, wherein the width of the first spacer is less than a width of the first mandrel feature and the width of the second spacer is less than a width of the second mandrel feature; and
   selectively removing the first mandrel feature and the second mandrel feature.

7. The method of claim 1, wherein the forming the first semiconductor material and the forming the second semiconductor material includes:
   epitaxially growing the first semiconductor material from the substrate to fill in the first fin trench until the the first semiconductor material extends over the HM layer in the second region of the HM layer; and
   epitaxially growing the second semiconductor material from the substrate to fill in the second fin trench until the the second semiconductor material extends over the HM layer in the second region of the HM layer.

8. The method of claim 1, wherein the HM layer is removed by a selective etch that does not substantially etch the first fin feature, the second fin feature, and the dielectric layer.

9. The method of claim 1, wherein the first fin trench and the second fin trench is further formed through a portion of the substrate.

10. The method of claim 1, wherein before removing the HM layer, a top surface of the first fin feature and a top surface of the second fin feature is substantially planar with a top surface of the HM layer.

11. A method for fabricating a semiconductor device, the method comprising:
   depositing a dielectric layer over a semiconductor substrate;
   depositing a hard mask (HM) layer over the dielectric layer;
   forming a mandrel feature over the HM layer;
   forming a spacer along a sidewall of the mandrel feature;
   selectively removing the mandrel feature;
   depositing a sacrificial layer over the spacer;
   etching back the sacrificial layer to expose the spacer;
   selectively removing the spacer to form an opening in the sacrificial layer;

etching the HM layer and dielectric layer through the opening and extending etching down to the semiconductor substrate to form a first fin trench, wherein the etching of the HM layer and the dielectric layer includes forming a second fin trench adjacent the first fin trench, the second fin trench extending through the HM layer, the dielectric and to the semiconductor substrate;

forming a first semiconductor feature in the first fin trench and over the HM layer, wherein forming the first semiconductor feature in the first fin trench includes forming a first semiconductor material directly on the semiconductor substrate such that the first semiconductor material extends form the semiconductor substrate to at least over the HM layer;

forming a second semiconductor feature in the second fin trench and over the HM layer, wherein forming the second semiconductor feature in the second fin trench includes forming a second semiconductor material directly on the semiconductor substrate such that the second semiconductor material extends form the semiconductor substrate to over the HM layer such that a first portion of the second semiconductor material directly interfaces with a first portion of the first semiconductor material formed over the HM layer, the second semiconductor material being different than the first semiconductor material; and removing the HM layer and the first portions of the first and second semiconductor materials to expose a second portion of the first semiconductor material to form a first fin feature, to expose a second portion of the second semiconductor material to form a second fin feature and to expose a top surface of the dielectric layer, the top surface of the dielectric layer facing away from the semiconductor substrate and the semiconductor material extending to the semiconductor substrate after the removal of the HM layer.

12. The method of claim 11, wherein etching the HM layer and dielectric layer through the opening and extending etching down to the semiconductor substrate to form the first fin trench includes etching a portion of the semiconductor substrate such that the first fin trench extends into the semiconductor substrate.

13. The method of claim 11, wherein etching back the sacrificial layer to expose the spacer includes recessing the sacrificial layer such that a top surface of the sacrificial layer is below a top surface of the spacer.

14. A method comprising:
forming a dielectric layer over a semiconductor substrate;
forming a hard mask layer over the dielectric layer;
forming a patterned first material layer over hard mask layer;
forming a second material layer on the patterned first material layer;
removing the patterned first material layer to form a patterned second material layer;
forming a first trench and a second trench extending thorough the hard mask layer, the dielectric layer, and into the semiconductor substrate by using the patterned second material layer as a mask;
forming a first semiconductor feature in the first trench and over the hard mask layer, wherein forming the first semiconductor feature in the first trench includes forming a semiconductor material directly on the semiconductor substrate such that the semiconductor material extends form the semiconductor substrate to at least over the hard mask layer;

forming a second semiconductor feature in the second trench and over the hard mask layer such that the second semiconductor feature directly interfaces with the first semiconductor feature over the hard mask layer, the second semiconductor feature being formed of a different semiconductor material than the first semiconductor feature; and removing the hard mask layer, a first portion of the first semiconductor feature and a first portion of the second semiconductor feature to expose a second portion of the first semiconductor feature, to expose a second portion of the second semiconductor feature and to expose a top surface of the dielectric layer, the top surface of the dielectric layer facing away from the semiconductor substrate and the semiconductor material extending to the semiconductor substrate after the removal of the hard mask layer.

15. The method of claim 14, wherein forming the first trench extending thorough the hard mask layer, the dielectric layer, and into the semiconductor substrate by using the patterned second material layer as the mask includes forming a third trench extending thorough the hard mask layer, the dielectric layer, and into the semiconductor substrate, and
wherein forming the first semiconductor feature in the first trench further includes forming a third semiconductor feature in the second trench.

16. The method of claim 15, wherein the first and third semiconductor features are formed of the same semiconductor material.

17. The method of claim 15, wherein the first semiconductor feature has a first sidewall disposed in the semiconductor substrate and the second semiconductor feature has a second sidewall disposed in the semiconductor substrate, and
wherein a portion of the semiconductor substrate extends continuously from the first sidewall to the second sidewall.

18. The method of claim 14, wherein forming the first semiconductor feature in the first trench includes performing an epitaxial growth process.

19. The method of claim 14, wherein the first trench includes a first sidewall formed of the semiconductor substrate and an opposing second sidewall formed of the semiconductor substrate, and
wherein after forming the first semiconductor feature in the first trench the first semiconductor feature extends from the first sidewall formed of the semiconductor substrate to the opposing second sidewall formed of the semiconductor substrate.

20. The method of claim 14, wherein forming the dielectric layer over the semiconductor substrate includes forming the dielectric layer directly on the semiconductor substrate such that the dielectric layer physically contacts the semiconductor substrate, and
wherein forming the hard mask layer over the dielectric layer includes forming the hard mask layer directly on the dielectric layer such that the hard mask layer physically contacts the dielectric layer.

* * * * *